United States Patent
Susak

[19]

[11] Patent Number: 5,925,921

[45] Date of Patent: Jul. 20, 1999

[54] GEOMETRICAL LAYOUT TECHNIQUE FOR A CIRCULAR CAPACITOR WITHIN AN ARRAY OF MATCHED CAPACITORS ON A SEMICONDUCTOR DEVICE

[75] Inventor: David Susak, Phoenix, Ariz.

[73] Assignee: Microchip Technology Incorporated, Chandler, Ariz.

[21] Appl. No.: 09/023,882

[22] Filed: Feb. 13, 1998

[51] Int. Cl.[6] .................................................. H07L 29/41
[52] U.S. Cl. ...................................... 257/532; 361/298.2
[58] Field of Search ......................... 257/532; 361/298.2

[56] References Cited

U.S. PATENT DOCUMENTS

| | | | |
|---|---|---|---|
| 2,606,955 | 8/1952 | Herrick | 361/298.2 |
| 4,542,444 | 9/1985 | Boland | 361/433 |
| 4,937,096 | 6/1990 | Arakawa et al. | 427/80 |
| 5,241,201 | 8/1993 | Matsuo et al. | 257/309 |
| 5,793,076 | 8/1998 | Fazan et al. | 257/298 |

FOREIGN PATENT DOCUMENTS 6-132478  5/1994  Japan ...................................... 257/532

*Primary Examiner*—David B. Hardy
*Attorney, Agent, or Firm*—Harry M. Weiss; Harry M. Weiss & Associates, P.C.

[57] ABSTRACT

A geometrical layout technique for an individual circular capacitor in a semiconductor device. Circular capacitors reduce the detrimental effects of (1) corner etching, (2) peripheral capacitance, (3) capacitor to capacitor coupling, and (4) electric field anomalies and result in superior capacitor matching. The circular capacitor is comprised of a circular bottom plate made of a conducting material, a circular dielectric material coupled to the bottom plate and a circular top plate made of a conducting material.

The circular capacitors may be arranged as an array in either a rectangular lattice layout or a diagonal lattice layout. These lattice layouts take advantage of the elimination or reduction of the problems encountered in the prior art such as corner etching, peripheral capacitance, capacitor to capacitor coupling and electric field anomalies.

13 Claims, 2 Drawing Sheets

GEOMETRICAL LAYOUT TECHNIQUE FOR A CIRCULAR CAPACITOR WITHIN AN ARRAY OF MATCHED CAPACITORS ON A SEMICONDUCTOR DEVICE

BACKGROUND OF THE INVENTION

1. Field of the Invention:

This invention relates generally to the geometrical layout of capacitors in semiconductor devices. Specifically, the present invention claims a circular layout technique for an individual capacitor in a semiconductor device and a plurality of circular capacitor lattices within semiconductor devices.

2. Description of the Prior Art:

The current state of the art describes the geometrical layout of capacitors in semiconductor devices where the individual capacitors are rectangular in shape and the lattices formed by the individual capacitors are similarly rectangular in shape. Semiconductor manufacturers have preferred rectangular devices because they optimize chip area and for ease of fabrication. However, rectangular capacitors result in poor "matching" of target value capacitance as between capacitors. Matching is defined as the ability to replicate a target value capacitance in farads within a given tolerance for an array of capacitors.

There are four effects detrimental to capacitor matching exhibited by rectangular capacitors. These effects include: (1) corner etching, (2) peripheral capacitance, (3) capacitor to capacitor coupling, and (4) electric field anomalies. These four effects, incidental to rectangular capacitors, are either eliminated or substantially reduced by circular capacitors.

Semiconductor capacitors are comprised of a dielectric material, typically an oxide, which is sandwiched between conductive bottom and top plates. Typically the top plate is smaller in area than the bottom plate to enhance the photolithography alignment process during fabrication. After alignment, the dielectric layer is chemically etched so that the perimeter of the dielectric layer is flush with the perimeter of the top plate.

Corner etching occurs in the manufacturing process when the chemical etching of the dielectric layer, inadvertently and unpredictably etches the corners of the top plate which results in rounded corners. These rounded corners affect the overall capacitance of the device and therefore inhibit accurate matching as between capacitors. Circular capacitors, having an absence of corners by definition, eliminate this detrimental effect.

Peripheral capacitance is defined as an ancillary capacitance that occurs between the top and bottom plates at the periphery of the device as a result of capacitive bridging beyond the dielectric layer. Peripheral capacitance is directly proportional to perimeter and inversely proportional to area. Therefore, peripheral capacitance is minimized when the ratio perimeter to area is minimized. Those skilled in the art will recognized that the circular configuration minimizes this ratio as compared to a rectangular capacitor.

Capacitor to capacitor coupling is the phenomenon of inadvertent capacitance as between individual capacitors. Coupling is a function of the proximity of capacitors and length of adjacent edges between capacitors. For two rectangular capacitors with adjacent edges, there is significant coupling along the entire length of the edge. However, for two adjacent circular capacitors, there is significant coupling capacitance only at the point of nearest proximity. As the plates begin to curve away from each other, coupling capacitance decreases dramatically.

Lastly, anomalous electric fields which are incidental to rectangular devices and the corner etching effect negatively affect capacitor matching. Electric fields radiate outward from the center of the capacitor. For rectangular devices, the electric field is first distorted by the rectangular shape and then further distorted by the cornering etching effect. The circular capacitor provides for a more uniform, concentric electric field. Those skilled in the art of semiconductor design will recognize that maintaining a uniform electric field as between capacitors will enhance capacitor matching.

In summary, the circular capacitor advances the art of semiconductor devices by providing for better matching as between capacitors within an array of capacitors by eliminating or reducing corner etching, peripheral capacitance, capacitor to capacitor coupling and electric field anomalies.

SUMMARY OF THE INVENTION

It is an object of the present invention to provide a geometrical layout technique for an individual circular capacitor in a semiconductor device.

It is another object of the present invention to provide a geometrical layout technique for an individual circular capacitor in a semiconductor device that improves capacitor matching by reducing the detrimental effects of (1) corner etching, (2) peripheral capacitance, (3) capacitor to capacitor coupling, and (4) electric field anomalies.

It is still another object of the present invention to provide a plurality of geometrical layout techniques for an array of circular capacitors in a semiconductor device.

One embodiment of the invention discloses a circular capacitor which is comprised of a circular bottom plate comprised of a conducting material, a circular dielectric material coupled to the bottom plate and a circular top plate comprised of a conducting material coupled to the dielectric material.

Another embodiment of the present invention discloses the arrangement of the circular capacitors in a rectangular or diagonal lattice layout that will eliminate or reduce the problems encountered in prior art such as corner etching, peripheral capacitance, capacitor to capacitor coupling and electric field anomalies.

Another embodiment of the invention discloses the fabrication of a circular capacitor array of capacitors within a semiconductor device with improved matching by eliminating or reducing the problems encountered in prior art such as corner etching, peripheral capacitance, capacitor to capacitor coupling and electric field anomalies.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENT

Figure 1:
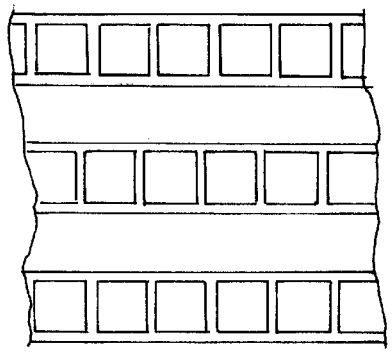
FIG. 1 is an overhead view of the prior art.

FIG. 1 shows an overhead view of individual capacitors within a semiconductor device which are rectangular in shape as found in prior art. Also note, the prior art defines an array of rectangular capacitors which is also rectangular in shape.

Figure 2A:
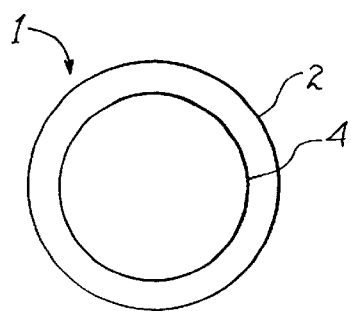
FIG. 2A is an overhead view of the circular capacitor.
Figure 2B:
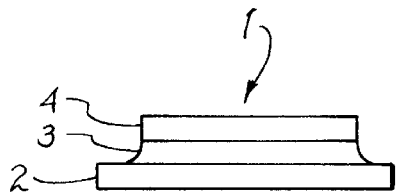
FIG. 2B is a side view of the circular capacitor

FIGS. 2A and 2B, respectively illustrate an overhead and a side view of a geometrical layout of a capacitor 1 within a semiconductor device where the capacitor 1 is circular in shape. The geometrical layout of the capacitor 1 within the semiconductor device comprises a circular bottom plate 2 composed of a conducting material, a circular dielectric material 3 coupled to the bottom plate 2, and a circular top plate 4 composed of a conducting material coupled to the circular dielectric material 3.

The circumference of the circular dielectric material 3 is approximately equal to the circumference of the circular top plate 4. The circumference of the circular bottom plate 2 is greater than the circumference of the circular top plate 4 to facilitate alignment of the two circular plates during tie fabrication process. The object during alignment is to have the total area of the top plate 4 subtended by the bottom plate 2.

The circular capacitor 1 is fabricated with a specific target value capacitance in farads. For a typical application in a semiconductor device the circular capacitor 1 has a target value capacitance of one (1) picofarad. However, the present invention is not limited to this target value capacitance. Those skilled in the art will recognize that the present invention will permit target value capacitances greater than or less than one (1) picofarad.

The geometrical layout of a capacitor within a semiconductor device further comprises a plurality of circular capacitors in an array. Consistent with an object of the present invention to provide a geometrical layout of a capacitor which improves matching, each of the plurality of circular capacitors in an array varies no more than a specific tolerance from the target value capacitance. In a typical application, this tolerance may be 0.01 percent from the target value capacitance. However. those skilled in the art will recognize that the present invention will permit tolerances from target value capacitances greater than or less than 0.01 percent.

Figure 3:
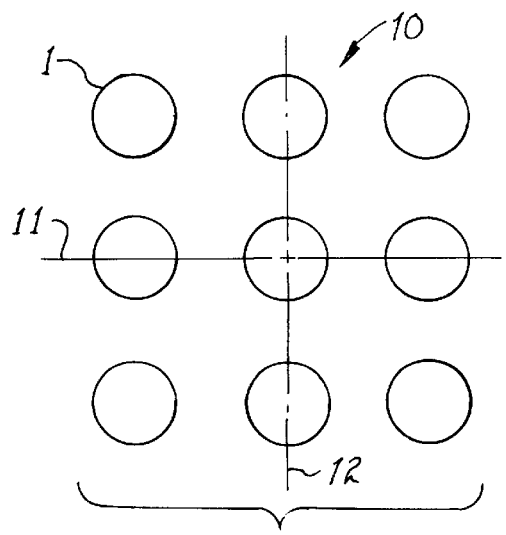
FIG. 3 is a diagram of a rectangular lattice of circular capacitors.

Referring to FIG. 3, wherein like numerals and symbols represent like elements, a diagram of a geometrical layout of a capacitor within a semiconductor device where the plurality of circular capacitors 1 in an array comprises a rectangular lattice 10 is shown. This geometrical layout of a capacitor within a semiconductor device has a plurality of circular capacitors 1 in an array which comprises a plurality of vertical columns of the circular capacitors and a plurality of horizontal rows of the circular capacitors in the same lattice. Those skilled in the art will note that the rectangular shape of the lattice is defined by the imaginary drawing of horizontal 11 and vertical 12 lines which pass through the centerpoints of every capacitor in each row and column.

Figure 4:
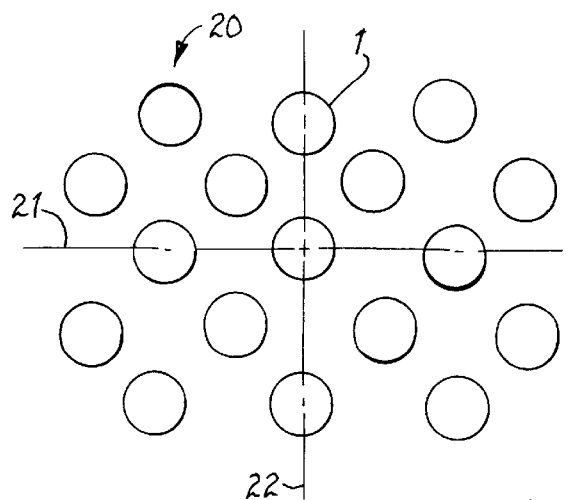
FIG. 4 is a diagram of a diagonal lattice of circular capacitors.

Referring to FIG. 4, wherein like numerals and symbols represent like elements, a diagram of a geometrical layout of a capacitor within a semiconductor device where the plurality of circular capacitors 1 in an array comprises a diagonal lattice 20 is shown. This geometrical layout of a capacitor within a semiconductor device also has a plurality of circular capacitors 1 in an array which comprises a plurality of vertical columns of the circular capacitors 1 and a plurality of horizontal rows of the circular capacitors 1. However, those skilled in the art will note that the diagonal shape of the lattice is defined by the offsetting of the adjacent rows and columns such that the imaginary drawing of horizontal 21 and vertical 22 lines passes through the centerpoints of the capacitors in every other row and column.

Figure 5:
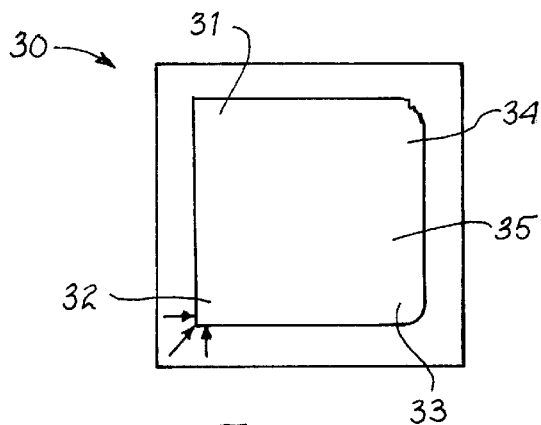
FIG. 5 is a overhead view of the corner etching effect upon the prior art.

Referring to FIG. 5, an overhead view of the corner etching effect upon the prior art rectangular capacitor 30 is shown. Corner 31 represents a corner of the top conductive plate 35 prior to etching of the dielectric material. Corner 32 represents the etching process of the dielectric material at the corner of the top plate 35. Note that the etching substance attacks the corner 32 from a plurality of angles thus causing unintended damage to the corner 32. Corner 33 represents a slightly rounded corner as a result of the etching process. Corner 34 represents an irregular misshaped corner as a result of the etching process. Together, corners 33 and 34 demonstrate the difficulty in maintaining a predictable uniform shape of the corners as a result of the etching process. Those skilled in the art of semiconductor capacitor design will recognize that unpredictable corner etching results in poor matching as between capacitors in an array.

The circular capacitor 1 (FIG. 2A) is not subject to the detrimental effect of corner etching for the simple reason that there are no corners subject to unintentional etching. Without the effect of corner etching the matching as between capacitors is improved.

Figure 6:
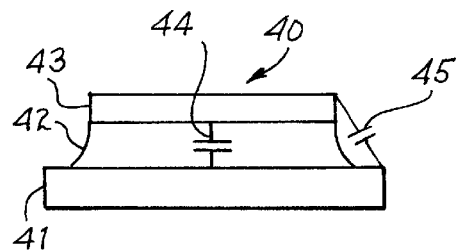
FIG. 6 is a side view of the peripheral capacitance effect upon a semiconductor capacitor.

Referring to FIG. 6, a side view of the peripheral capacitance effect upon a semiconductor capacitor 40 (regardless of geometry) is shown. The intended capacitance 44 occurs as a result of the dielectric material 42 which is located between the bottom plate 41 and the top plate 43. Peripheral capacitance 45 occurs as ancillary capacitance between the bottom plate 41 and top plate 43 at the periphery of the device as a result of capacitive bridging beyond the dielectric material 42. Although shown only once in FIG. 6, peripheral capacitance 45 occurs over the entire perimeter of the device. Peripheral capacitance 45 is unpredictable and inconsistent because it occurs beyond the dielectric material 42. Thus, peripheral capacitance 45 results in poor matching over an array of capacitors.

Peripheral capacitance is directly proportional to perimeter and inversely proportional to area. Therefore, peripheral capacitance is minimized when the ratio of perimeter to area is minimized. The perimeter to area ratio for a square capacitor is $4X/X^2$ or $4/X$, where X is the length of one side of the square. The perimeter to area ratio for a circle is $2\Pi X/\Pi X^2$ or $2/X$, where in this case, X is the radius of the circle. Thus, because the geometrical layout of a capacitor within a semiconductor device of a circular capacitor provides for reducing peripheral capacitance as a function of perimeter to area, it therefore improves matching.

Figure 7A:
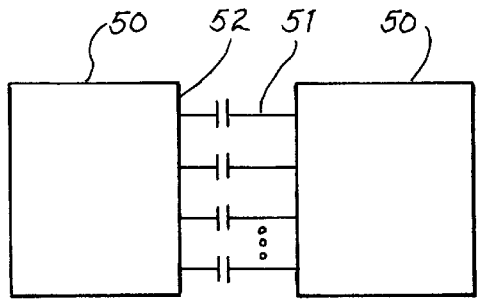
FIG. 7A is a overhead view of the capacitor to capacitor coupling effect upon the prior art.

Referring to FIG. 7A, a overhead view of the capacitor to capacitor coupling effect 51 between rectangular capacitors 50 found in the prior art is shown. Note that the coupling effect occurs relatively consistently along the entire length 52 of adjacent capacitors 50.

Figure 7B:
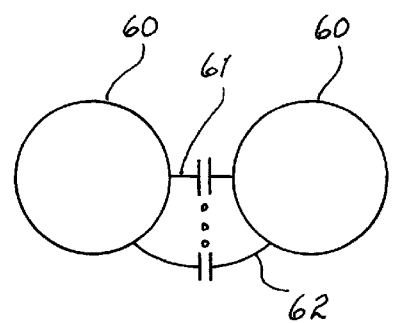
FIG. 7B is an overhead view of the capacitor to capacitor coupling effect upon the present invention.

Referring to FIG. 7B, an overhead view of the geometrical layout of a capacitor within a semiconductor device where the circular capacitors 60 provides a means for reducing capacitor to capacitor coupling is disclosed. Because coupling is a function of the proximity of capacitors and length of adjacent edges between capacitors, as the circular plates 60 begin to curve away from each other, coupling capacitance decreases dramatically. For two adjacent circular capacitors 60, there is significant coupling capacitance 61 only at the point of closest proximity. Thus, the capacitor to capacitor coupling 62 is significantly less than the coupling 61. Because capacitor to capacitor coupling is an unintended and therefore unpredictable event, lower capacitor coupling results in better matching over an array of capacitors.

Figure 8A:
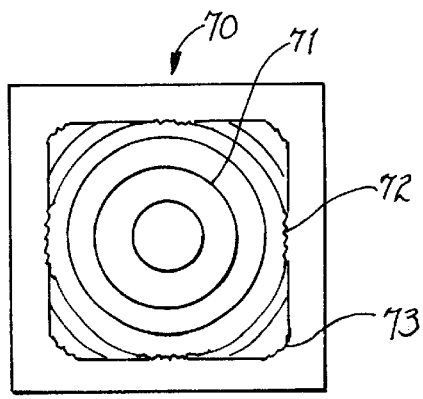
FIG. 8A is an overheard view of the electric field anomaly effect upon the prior art.

Referring to FIG. 8A, an overheard view of the electric field anomaly effect upon rectangular capacitors found in the prior art is shown. For rectangular devices 70, the electric field 71, which radiates from the center of the device 70, is first distorted by the rectangular shape 72 and then further distorted by the cornering etching effect 73.

Figure 8B:
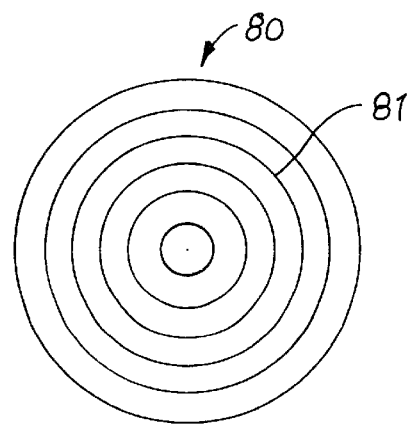
FIG. 8B is an overheard view of the electric field effect upon the present invention.

Referring to FIG. 8B, an overheard view of the geometrical layout of a capacitor within a semiconductor device where the circular capacitor 80 provides a means for reducing electric field anomalies. The circular capacitor provides for a more uniform, concentric electric field 81. Since capacitance is generated by the presence of an electric field over a dielectric layer, those skilled in the art of semiconductor design will recognize that maintaining a uniform electric field as between capacitors will enhance capacitor matching.

Although the invention has been particularly shown and described with reference to a preferred embodiment thereof, it will be understood by those skilled in the art that changes in form and detail may be made therein without departing from the spirit and scope of the invention.

What is claimed is:

1. The geometrical layout of a capacitor within a semiconductor device, comprising:

a circular bottom plate composed of a conducting material;

a circular dielectric material coupled to the bottom plate; and a circular top plate composed of a conducting material coupled to the circular dielectric material;

wherein the capacitor is circular in shape;

wherein the circumference of the circular dielectric material is approximately equal to the circumference of the circular top plate; and wherein the circumference of the circular bottom plate is greater than the circumference of the circular top plate.

2. The geometrical layout of a capacitor within a semiconductor device in accordance with claim 1 wherein the capacitor has a target value capacitance.

3. The geometrical layout of a capacitor within a semiconductor device in accordance with claim 2 wherein the capacitor has a target value capacitance of 1 picofarad.

4. The geometrical layout of a capacitor within a semiconductor device in accordance with claim 2 further comprising a plurality of circular capacitors in an array.

5. The geometrical layout of a capacitor within a semiconductor device in accordance with claim 4 wherein each of the plurality of circular capacitors in an array varies no more than 0.01 percent from the target value capacitance.

6. The geometrical layout of a capacitor within a semiconductor device in accordance with claim 4 wherein the plurality of circular capacitors in an array comprises:

a plurality of vertical columns of the circular capacitors; and a plurality of horizontal rows of the circular capacitors.

7. The geometrical layout of a capacitor within a semiconductor device in accordance with claim 6 wherein the plurality of circular capacitors in an array comprises a rectangular lattice.

8. The geometrical layout of a capacitor within a semiconductor device in accordance with claim 6 wherein the plurality of circular capacitors in an array comprises a diagonal lattice.

9. The geometrical layout of a capacitor within a semiconductor device in accordance with claim 2 wherein the circular capacitor provides a means for fabricating a plurality of circular capacitors in an array with improved matching.

10. The geometrical layout of a capacitor within a semiconductor device in accordance with claim 9 wherein the circular capacitor provides a means for eliminating corner etch effects during fabrication.

11. The geometrical layout of a capacitor within a semiconductor device in accordance with claim 9 wherein the circular capacitor provides a means for reducing peripheral capacitance.

12. The geometrical layout of a capacitor within a semiconductor device in accordance with claim 9 wherein the circular capacitor provides a means for reducing capacitor to capacitor coupling.

13. The geometrical layout of a capacitor within a semiconductor device in accordance with claim 9 wherein the circular capacitor provides a means for reducing electric field anomalies.

\* \* \* \* \*